United States Patent
Zoller et al.

(10) Patent No.: US 9,679,793 B2
(45) Date of Patent: *Jun. 13, 2017

(54) OPTICAL MONITORING SYSTEM FOR COATING PROCESSES

(75) Inventors: Alfons Zoller, Bad Soden Salmunster (DE); Hans Dirk Wolf, Dreieich (DE); Christopher Schmitt, Rodenbach (DE); Michael Boos, Brachttal (DE); Werner Klug, Freigericht (DE)

(73) Assignee: LEYBOLD OPTICS GMBH, Alzenau (DE)

( * ) Notice: Subject to any disclaimer, the term of this patent is extended or adjusted under 35 U.S.C. 154(b) by 1279 days.

This patent is subject to a terminal disclaimer.

(21) Appl. No.: 11/885,148

(22) PCT Filed: Feb. 23, 2006

(86) PCT No.: PCT/EP2006/001668
§ 371 (c)(1),
(2), (4) Date: Oct. 10, 2008

(87) PCT Pub. No.: WO2006/089752
PCT Pub. Date: Aug. 31, 2006

(65) Prior Publication Data
US 2009/0214760 A1    Aug. 27, 2009

(30) Foreign Application Priority Data

Feb. 26, 2005    (DE) .................. 10 2005 008 889

(51) Int. Cl.
*G01B 11/28*    (2006.01)
*H01L 21/67*    (2006.01)
(Continued)

(52) U.S. Cl.
CPC .... *H01L 21/67253* (2013.01); *B05C 11/1005* (2013.01); *C23C 14/547* (2013.01);
(Continued)

(58) Field of Classification Search
CPC ......... C23C 14/00; C23C 14/22; C23C 14/54; C23C 14/542; C23C 14/545;
(Continued)

(56) References Cited

U.S. PATENT DOCUMENTS 3,892,490 A * 7/1975 Uetsuki et al. ................ 356/388
3,994,586 A * 11/1976 Sharkins et al. ................ 356/73
(Continued)

FOREIGN PATENT DOCUMENTS

DE      3610733 A1    1/1987
DE      10348898 A1 *    4/2004    ............. G01B 11/06
(Continued)

OTHER PUBLICATIONS

Allam D. S et al: "NOTES; A piezoelectric beam chopper" Dec. 1, 1970, Journal of Physics E. Scientific Instruments, IOP Publishing, Bristol, GB, pp. 1022-1023; XP020019575; ISSN: 0022-3735.
(Continued)

*Primary Examiner* — Karl Kurple
(74) *Attorney, Agent, or Firm* — Cantor Colburn LLP

(57) ABSTRACT

The invention concerns an optical monitoring system for the measurement of layer thicknesses of thin coatings applied in a vacuum, particularly on moving substrates, during the coating process, in which the light intensity of the light of a light source injected into a reference light guide and released by a first piezoelectric or electrostrictive or magnetostrictive light chopper is registered by a light detector unit in a reference phase, the light of the light source in a measuring phase is injected into a first measuring light guide and the light released by a second piezoelectric or electrostrictive or magnetostrictive light chopper is directed to the substrate, and the light intensity of the light reflected or transmitted from the substrate is registered by the light detector unit through a second measuring light guide, and a remaining
(Continued)

light intensity is registered by the light detector unit in at least one dark phase, wherein the reference phase, the measuring phase, and the dark phase are shifted in time by the light chopper and are digitally adjusted depending on the position of the substrate.

8 Claims, 2 Drawing Sheets

(51) Int. Cl.
*B05C 11/10* (2006.01)
*C23C 14/54* (2006.01)
*G01B 11/06* (2006.01)
*B05B 12/08* (2006.01)
*G01B 5/06* (2006.01)

(52) U.S. Cl.
CPC ...... *G01B 11/0625* (2013.01); *G01B 11/0683* (2013.01); *B05B 12/084* (2013.01); *G01B 5/066* (2013.01)

(58) Field of Classification Search
CPC ....... C23C 14/547; G01B 11/00; G01B 11/02; G01B 11/06; G01B 11/0616; G01B 11/0625; G01B 11/0683; G01B 5/066; G02B 26/02; G02B 26/04; H01L 21/67253; B05C 11/1005; B05B 12/084
USPC .......... 118/712, 715, 726; 427/10, 8, 9, 162; 250/341.3, 341.5, 345, 350, 351; 356/4.01, 432, 503, 630, 625
See application file for complete search history.

(56) References Cited

U.S. PATENT DOCUMENTS

| | | | | |
|---|---|---|---|---|
| 4,015,127 A | * | 3/1977 | Sharkins | 250/341.3 |
| 4,207,835 A | * | 6/1980 | Schwiecker et al. | 118/664 |
| 4,310,243 A | * | 1/1982 | Brown et al. | 356/300 |
| 4,320,967 A | * | 3/1982 | Edgar | 356/51 |
| 4,469,713 A | * | 9/1984 | Schwiecker | G01B 11/0633 356/632 |
| 4,483,725 A | * | 11/1984 | Chang | 427/8 |
| 4,582,431 A | * | 4/1986 | Cole | 356/632 |
| 4,616,210 A | * | 10/1986 | Ferber et al. | 341/122 |
| 4,762,412 A | * | 8/1988 | Ohkubo et al. | 356/319 |
| 4,800,326 A | * | 1/1989 | Unsworth | 318/729 |
| 4,832,490 A | * | 5/1989 | Boos et al. | 356/325 |
| 4,837,044 A | * | 6/1989 | Murarka et al. | 427/10 |
| 4,878,755 A | * | 11/1989 | Siegmund et al. | 356/632 |
| 5,007,741 A | * | 4/1991 | Carver et al. | 356/448 |
| 5,260,574 A | * | 11/1993 | Becker | 250/338.1 |
| 5,354,575 A | * | 10/1994 | Dagenais et al. | 427/10 |
| 5,477,321 A | | 12/1995 | Johnson | |
| 5,502,781 A | | 3/1996 | Li et al. | |
| 5,564,830 A | * | 10/1996 | Bobel et al. | 374/126 |
| 5,688,049 A | * | 11/1997 | Govorkov | 374/44 |
| 5,696,583 A | * | 12/1997 | Yoon | 356/497 |
| 5,745,240 A | * | 4/1998 | Frakso et al. | 356/632 |
| 5,754,297 A | * | 5/1998 | Nulman | 356/630 |
| 5,786,535 A | * | 7/1998 | Takeuchi et al. | 73/624 |
| 5,801,762 A | * | 9/1998 | Dianna et al. | 348/65 |
| 5,911,856 A | * | 6/1999 | Suzuki et al. | 204/192.13 |
| 6,039,806 A | * | 3/2000 | Zhou | C23C 14/30 118/50.1 |
| RE36,731 E | * | 6/2000 | Fukuda et al. | 355/53 |
| 6,338,775 B1 | * | 1/2002 | Chen | 204/192.11 |
| 6,486,955 B1 | * | 11/2002 | Nishi | 356/401 |
| 6,549,291 B1 | * | 4/2003 | Dieter et al. | 356/630 |
| 6,560,176 B1 | * | 5/2003 | Heylen | 369/53.1 |
| 6,579,420 B2 | * | 6/2003 | Wan et al. | 204/192.11 |
| 6,620,249 B2 | * | 9/2003 | Grezes-Besset | 118/713 |
| 7,096,085 B2 | * | 8/2006 | Paik | G05B 13/041 700/108 |
| 7,113,284 B1 | * | 9/2006 | Meeks | G01B 11/0616 257/E21.53 |
| 7,119,908 B2 | * | 10/2006 | Nomoto | B24B 37/013 356/504 |
| 7,130,029 B2 | * | 10/2006 | Wack | G01N 21/211 257/E21.53 |
| 7,244,937 B1 | * | 7/2007 | Gabura et al. | 250/341.2 |
| 7,247,345 B2 | * | 7/2007 | Takahashi et al. | 427/162 |
| 7,345,765 B2 | * | 3/2008 | Atanasov | G01N 21/55 356/369 |
| 7,435,300 B2 | * | 10/2008 | Ling et al. | 118/720 |
| 7,857,946 B2 | * | 12/2010 | Kitano et al. | 204/192.12 |
| 2002/0045283 A1 | * | 4/2002 | Hasegawa et al. | 438/16 |
| 2002/0139783 A1 | * | 10/2002 | Troitski | 219/121.68 |
| 2002/0142493 A1 | * | 10/2002 | Halliyal et al. | 438/14 |
| 2002/0176097 A1 | * | 11/2002 | Rodgers | 356/630 |
| 2002/0189542 A1 | * | 12/2002 | Van Slyke et al. | 118/712 |
| 2003/0016346 A1 | * | 1/2003 | Umeda et al. | 356/72 |
| 2003/0022400 A1 | * | 1/2003 | Nomoto et al. | 438/14 |
| 2003/0085115 A1 | * | 5/2003 | Tani et al. | 204/192.13 |
| 2003/0223086 A1 | * | 12/2003 | Semersky et al. | 356/630 |
| 2004/0026240 A1 | * | 2/2004 | Shidoji et al. | 204/298.03 |
| 2004/0046969 A1 | * | 3/2004 | Anderson | 356/630 |
| 2004/0085535 A1 | | 5/2004 | Hammer et al. | |
| 2004/0131300 A1 | * | 7/2004 | Atanasov | G01N 21/55 385/12 |
| 2005/0247877 A1 | * | 11/2005 | Mackin et al. | 250/341.1 |
| 2007/0260422 A1 | * | 11/2007 | Marcus | H01L 22/12 702/172 |
| 2007/0296966 A1 | * | 12/2007 | Benicewicz et al. | 356/318 |
| 2007/0297175 A1 | * | 12/2007 | Glent-Madsen | 362/282 |
| 2008/0285060 A1 | * | 11/2008 | Zoller et al. | 356/630 |
| 2012/0320184 A1 | * | 12/2012 | Seyfried | 348/79 |
| 2013/0094025 A1 | * | 4/2013 | Nishida et al. | 356/432 |
| 2014/0037840 A1 | * | 2/2014 | Ha | 427/162 |

FOREIGN PATENT DOCUMENTS

| | | |
|---|---|---|
| EP | 0 257 229 | 3/1988 |
| JP | 1988-300933 A | 12/1988 |
| JP | 1997-154288 A | 6/1997 |
| WO | 02/40737 | 5/2002 |
| WO | WO 0240737 A1 * | 5/2002 |

OTHER PUBLICATIONS

International Search Report; PCT/EP2006/001668; Apr. 28, 2006.
Korean Office Action issued Aug. 23, 2012 re: Korean Application No. 10-2007-7021788; citing: U.S. Pat. No. 4,832,490, JP 1997-154288 A and JP 1988-300933 A.

* cited by examiner

OPTICAL MONITORING SYSTEM FOR COATING PROCESSES

CROSS-REFERENCE TO RELATED APPLICATIONS

This is a national stage application under 35 USC 371 of and claims priority to International Application PCT/EP2006001668, filed Feb. 23, 2006 and claims priority to DE 10 2005 008 889.9, filed Feb. 26, 2005.

TECHNICAL FIELD

The invention concerns an optical monitoring system for coating processes, particularly for the measurement of layer thicknesses of layers applied to moving substrates during the coating process whereby signals are generated in measurement, reference, and dark phases that follow each other in a timed sequence, and are evaluated for measuring the transmission or reflection from substrates.

BRIEF DISCUSSION OF RELATED ART

For substrates that are coated with thin layers in the scale of light-wave lengths to achieve prescribed optical properties, layers must be applied with high evenness and exact layer thickness to achieve the prescribed transmission or reflection properties. Layer thickness is transmitted by transmission and reflection measurements and takes place in situ in order to precisely control layer thickness. For measuring such thin layer thicknesses, photometers are frequently used that include a monochromatic transmission or reflection signal of the coated substrate in a measuring phase and a reference signal of the light source of the photometer. However, such photometer configurations have the disadvantage that signals are recorded by two different detectors, the drifts of which affect the measurement result, and in doing so, changes in the color temperature of the light source are only insufficiently considered.

To eliminate these disadvantages, EP 0 257 229 B1 proposes generating a measurement phase, a reference phase, and a dark phase, one after the other in time, by means of a chopper that consists of two chopper disks revolving about an axis, with openings, not overlapping each other, at an angle of 120°, respectively, between which the light source is arranged. The registration of light signals in the measuring and reference phases takes place with a light detector in the same wavelength, adjusted with a monochromator, so that aging and temperature drift can be compensated for by the light source and the detector. The dark phase serves as compensation for errors from outside influences and drifts from electronic amplifiers. A processor unit evaluates the signals.

In the coating of small-format substrates it is common to arrange several substrates on revolving substrate carriers. If a layer thickness measurement should take place during the coating process with a photometer arrangement described above on the revolving substrate carrier, there must be an exact synchronization between the chopper drive and the substrate rotary operating mechanism, as unsynchronized drives will produce a time jitter in the amount of the period of the chopper, which will result in an undesired variation in the measuring point on the substrate.

By synchronizing the rotary operating mechanism this time jitter can be reduced, though not eliminated entirely.

BRIEF SUMMARY

The invention improves further the precision of the layer thickness measurement of thin layers applied on substrates during the coating process.

The optical monitoring system according to the invention comprises a light source, a light detector unit, a reference light guide by which the light of the light source is supplied or is able to be supplied to the light detector unit, a first measuring light guide, with which the light of the light source is directed or is able to be directed onto a substrate, and a second measuring light guide, with which the light from the light source reflected or transmitted from the substrate is supplied or can be supplied to the light detector unit. A first piezoelectric or electrostrictive or magnetostrictive light chopper is arranged in the reference light guide, and a second piezoelectric or electrostrictive or magnetostrictive light chopper is arranged in the first or second measuring light guide. Thus, the first and second light choppers are connected to a processor unit for generating a measuring phase, a reference phase, and at least one dark phase.

A further optical monitoring system according to the invention comprises a light source, a light detector unit, a first measuring light guide, by which the light of the light source is directed or is able to be directed onto a substrate, and a second measuring light guide, by which the light from the light source transmitted from the substrate is supplied or able to be supplied to the light detector unit. A piezoelectric or electrostrictive or magnetostrictive light chopper is arranged in the first or second measuring light guide. In this case the reference light path is formed by at least one corresponding opening in a revolving substrate carrier that clears the light path during the movement of the substrate carrier. On a revolving substrate carrier the opening can be designed as a free drill hole, for example, on the same radius on which one or several substrates are arranged. Reference measuring is then executed when the free drill hole crosses the light beam. The chopper clears the light path during the measuring and reference phases. In the dark phase the chopper closes the light path.

In the process according to the invention, the light intensity of a light source in a reference phase, the light intensity of the light reflected or transmitted from the substrate in a measuring phase, and the remaining light intensity in at least one dark phase is registered by a light detector unit for the layer thickness measurement of steamed or dusted layers on moving substrates, in particular revolving about an axis during the coating process, wherein the reference phase, measuring phase, and dark phase are staggered in time by at least one piezoelectric, electrostrictive, or magnetostrictive light chopper and are digitally adjusted in dependence on the position of the substrate.

In a preferable embodiment, the light intensity of the light from a light source injected into a reference light guide and cleared by a first piezoelectric or electrostrictive or magnetostrictive light chopper is registered in a reference phase, in a measuring phase the light from the light source is injected into a first measuring light guide and the light cleared by a second piezoelectric or electrostrictive or magnetostrictive light chopper is directed onto the substrate and the light intensity of the light reflected or transmitted from the substrate is registered by the light detector unit over a second measuring light guide. Then, the second light chopper closes the first measuring light guide in the reference phase and the first light chopper closes the reference light guide in the measuring phase. In addition, in at least one dark phase the remaining light intensity is registered by the light detector unit, wherein the first light chopper closes the reference light guide and the second light chopper closes the first measuring light guide. The reference phase, the measuring phase, and the dark phase are staggered in time by the corresponding settings of the light choppers, and are digitally focused based upon the position of the substrate.

If the reference light guide is not applied and the reference measuring occurs over the measuring light guide, it is preferable that the reference phase, measuring phase, and dark phase are implemented by a light chopper arranged in the first or second measuring light guide.

The focusing of reference, measuring, and dark phases with piezoelectric or electrostrictive or magnetostrictive light choppers enables a direct and very exact positioning of the individual phases by means of the flexible digital control of the light choppers that is available at all times. The measuring phases can thereby be synchronized exactly with the desired measuring point of the substrate.

The piezoelectric light choppers are piezoelectric actuators that execute a positioning movement upon electrical activation. In this, an electric field is applied to a piezocrystal and a length variation is produced in the direction of the field intensity. If the deformation is hindered from the outside a force arises that acts in the direction of the deformation. Thus, electrical energy is converted into mechanical energy. Piezoeletric actuators can also be described simply by their capability of converting electrical tensions into mechanical motion. Piezoeletric effects are observed in various crystalline substances like quartz, sodium potassium tartrate, and ethylene diamine tartrate, as examples.

Alternatively to piezoeletric actuators, electrostrictive or magnetostrictive actuators can be installed as light choppers. With electrostrictive actuators, symmetrical crystals are changed depending on the electrical field. Magnetostrictive actuators change their geometric properties by applying an outside magnetic field.

In a preferable embodiment of the invention, the light detector unit comprises a dispersive element, in particular a monochromator, and a light detector by which the light wave length of the light directed at the light detector can be focused by the dispersive element and spectrophotometrical measurements are possible.

For the further treatment of light intensities detected by the light detector, the signals adjacent to the exit of the light detector are preferably amplified and digitalized by means of an A/D converter. Then the registered values can be set up in a processor unit by the creation of differential values from the measuring and dark phases and from the reference and dark phases. The relationship between the differential values thus determined ($I_{meas}-I_{dark}-/I_{ref}-I_{dark}$) forms a measure for the reflection or transmission of the coated substrate. Preferably, an adjustment of the amplifier will also take place through the processor unit depending on the respective phase since the difference between the light intensity in the measuring phase and the reference phase can be very great. The degree of amplification should preferably be adjusted such that the largest possible signal is available at the A/D converter in order to achieve a high signal resolution.

Further, it is preferable if the processor unit is connected or can be connected to a rotary operating mechanism of a substrate carrier for the registration of the position of the substrate arranged on the substrate carrier. This is possible preferably by means of an incremental encoder coupled to the rotating operation mechanism, which sets a counter at a defined value with each revolution on a defined rotation angle, and sends pulses to the counter depending on the rotation angle. A rotation angle and thereby the position of the substrate can thus always be assigned to the counter reading. The counter reading is evaluated by the processor unit, and from that signals are generated to control the light choppers for adjustment of the reference, measuring, and dark phases.

In a further advantageous embodiment of the invention, the measuring of the transmission or reflection can take place continuously on stationary substrates during the steaming process. The adjustment of the reference, measuring, and dark phase then takes place periodically by means of an integrated time control into the processor unit. The sequence as well as the duration of the individual phases can be freely controlled. The frequency with which the light choppers are adjusted for set-up of the individual phases can be thus chosen such that any interfering frequencies from outside light of the steaming source or the noise of the light detector can be maximally suppressed. Typical frequencies lie in the range from 5 to 100 Hz.

BRIEF DESCRIPTION OF THE DRAWINGS

The invention will now be described further in more detail with reference to exemplary embodiments. Shown are.

DETAILED DESCRIPTION

Figure 1:
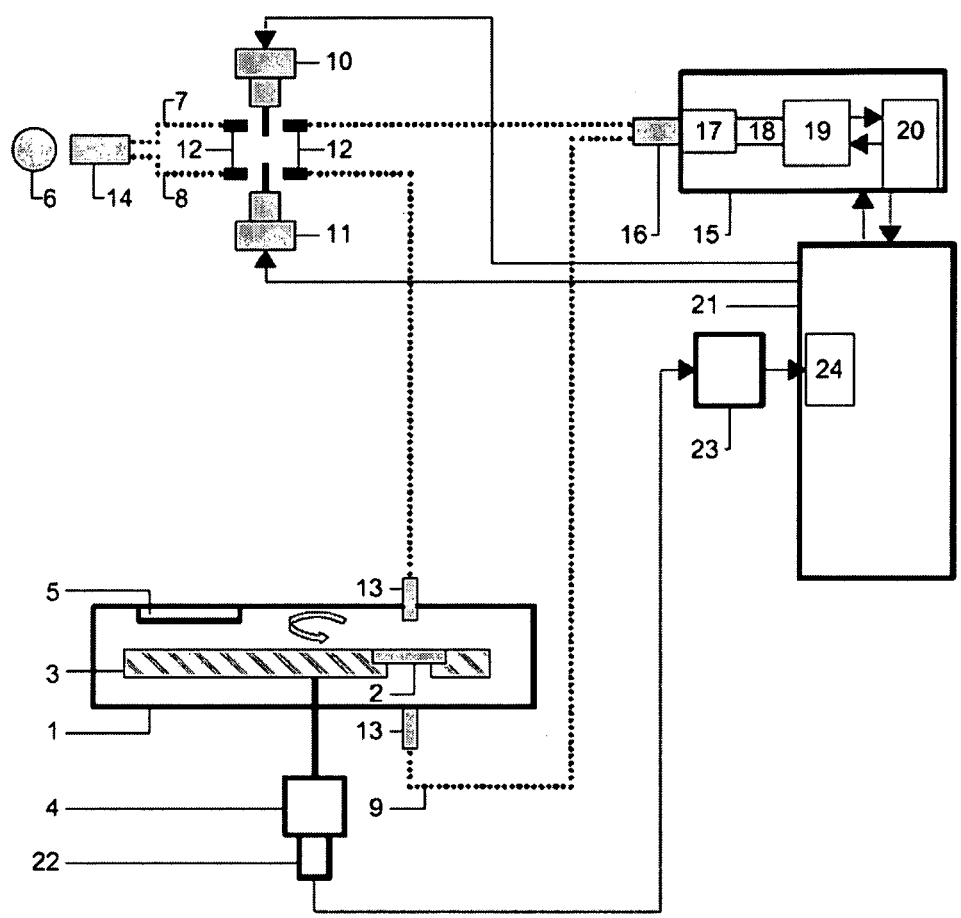
FIG. 1 a schematic representation of an optical monitoring system with two light choppers FIG. 2 a schematic representation of an optical monitoring system with one light chopper.

The optical monitoring system shown in FIG. 1 for measuring the layer thickness of a substrate revolving about an axis during a coating process operates with two light choppers to generate the measuring, reference, and dark phases.

The substrate 2 is arranged in the coating chamber 1 on a disk-shaped substrate carrier 3 ca. 300 mm removed from the rotational axis. The substrate carrier 3 is moved by the rotating mechanism 4 at ca. 200 R/min and is coated by one or several coating sources 5 in a vacuum. The substrate 2 is transparent, for example glass, so that a layer thickness determination can take place with a transmission measurement.

For measurement, a light source 6 injects light into a first light guide injector 14. The first light guide injector 14 leads the reference light guide 7 and the first measuring light guide 8 together in front of the light source 6. In the reference light guide 7 there is a first piezoelectric light chopper 10 arranged between two light guide heads 12 of the reference light guide 7, and in the first measuring light guide 8 there is a second piezoelectric light chopper 11 arranged between two further light guide heads 12. The light guide heads 12 can also be configured as optical collimators. The chopper rims of the first and second piezoelectric light choppers 10, 11 can be so moved with respective actuators independently of one another, so that the light is blocked, or guided on unhindered. The light guide heads 12 are to be brought to the light chopper rims as tightly as possible. The control of the "open" or "closed" position of the piezoelectric light choppers 10, 11 takes place with the processor unit 21.

At the end of the first measuring light guide 8, a light guide head is fastened with collimator 13. This is arranged in a vacuum of the coating chamber 1 such that the light from the first measuring light guide 8 reaches the substrate 2.

The light guide head fastened on the second measuring light guide 9 with the collimator 13 is arranged on a view window of the coating chamber 1 such that the light transmitted from the substrate can be received and guided to the light detector unit 15.

The light of the reference light guide 7 is likewise directed to the light detector unit 15. In front of the monochromator 17 of the light detector unit 15 the second measuring light guide 9 and the reference light guide 7 are brought together in a second light guide injector 16.

A light detector 18 is fixed at the exit of the monochromator 17. The light detector 18 can be realized as a signal detector that measures monochromatic light or as a line detector that measures light of several wavelengths simultaneously. The exit signals of the light detector 18 are amplified in the amplifier 19 and digitalized by an A/D converter 20. The point of time of the digitalization is set by the processor unit 21. The processor unit 21 reads the digitalized values and processes them further.

An incremental encoder 22 is rigidly coupled with the drive shaft of the rotation mechanism 4 of the substrate carrier 3. The signal of the incremental encoder 22 is switched to a counter 23. The counter 23 gets a null impulse from the incremental encoder 22 with each rotation at a defined rotation angle. The null impulse sets the counter 23 to null or to a defined value. A transmission of the incremental encoder 22 sends pulses to the counter 23 depending on the rotation angle. A typical value is 2048 pulses per revolution. The counter 23 is incremented or decremented by the pulses. In this way a defined rotation angle can be assigned to the actual counter reading. A comparator 24 programmed by the processor unit 21 evaluates the counter and sends a signal to the processor unit 21 upon the preprogrammed counter reading.

Measuring Provides at Least Three Phases:

Measuring Phase:

The chopper rim of the first piezoelectric light chopper 10 is closed and blocks light passage with the reference light guide 7. The chopper rim of the second piezoelectric light chopper 11 is open so that the light from the light source 6 is directed through the first measuring light guide 8 to the substrate 2. The substrate 2 is illuminated once per each revolution. The light transmitted by the substrate 2 is further guided over the second measuring light guide 9 to the light detector unit 15.

In the most simple case, the monochromator 17 is a line filter with only one conducting wavelength. However, it is advantageous to use a grid monochromator with adjustable wavelengths. In this manner an advantageous wavelength can be chosen based upon the layer thickness. The wavelength of the monochromator 17 is adjusted to the desired value before the start of coating.

Instead of a monochromator 17 a so-called polychromator with a row detector can also be used. With that, a diode or CCD row is illuminated by an optical grid. Each single element is illuminated with another wavelength. Thus an entire wavelength spectrum is simultaneously measurable.

The beginning and end of the measuring period are adjusted by the comparator 24 for the A/D converter 20 such that measuring takes place while the substrate 2 is located in the optical path. At the end of the measuring period the digitalized value of the measurment is read out by the processor unit 21.

Reference Phase:

The chopper rim of the second piezoelectric light chopper 12 is closed and blocks light passage with the first measuring light guide 8. The chopper rim of the first piezoelectric light chopper 11 is open so that the light from the light source 6 is further directed through the reference light guide 7 to the light detector unit 15. The monochromator adjustment is unchanged vis-à-vis the measuring phase. The beginning and end of the measuring period are thus independent of the angle position of the substrate 2, but are defined likewise by the counter 23 and the comparator 24. Reference measuring takes place sensibly immediately before or after a measuring phase. At the end of the measuring period the digitalized value of the measurement is read out by the processor unit 21.

Dark Phase:

The chopper rim of the first and second piezoelectric light choppers 10, 11 is closed. The beginning and end of the measuring period are likewise independent of the angle position of the substrate 2 and are defined by the counter 23 and comparator 24. Dark measuring takes place sensibly immediately before or after a measuring phase and/or a reference phase. At the end of the measuring period the digitalized value of the measurement is read out by the processor unit 21.

After the conclusion of the phases the measurement values are calculated thus: The differential values of the light intensities from the measuring and dark phases as well as from the reference and dark phases are put into the ratio $(I_{meas}-I_{dark}/I_{ref}-I_{dark})$. So a measurement value is available that is proportional to the light transmission of the substrate 2. Fluctuations in the light source 6 and in the sensitivity of the detector are compensated.

Figure 2:
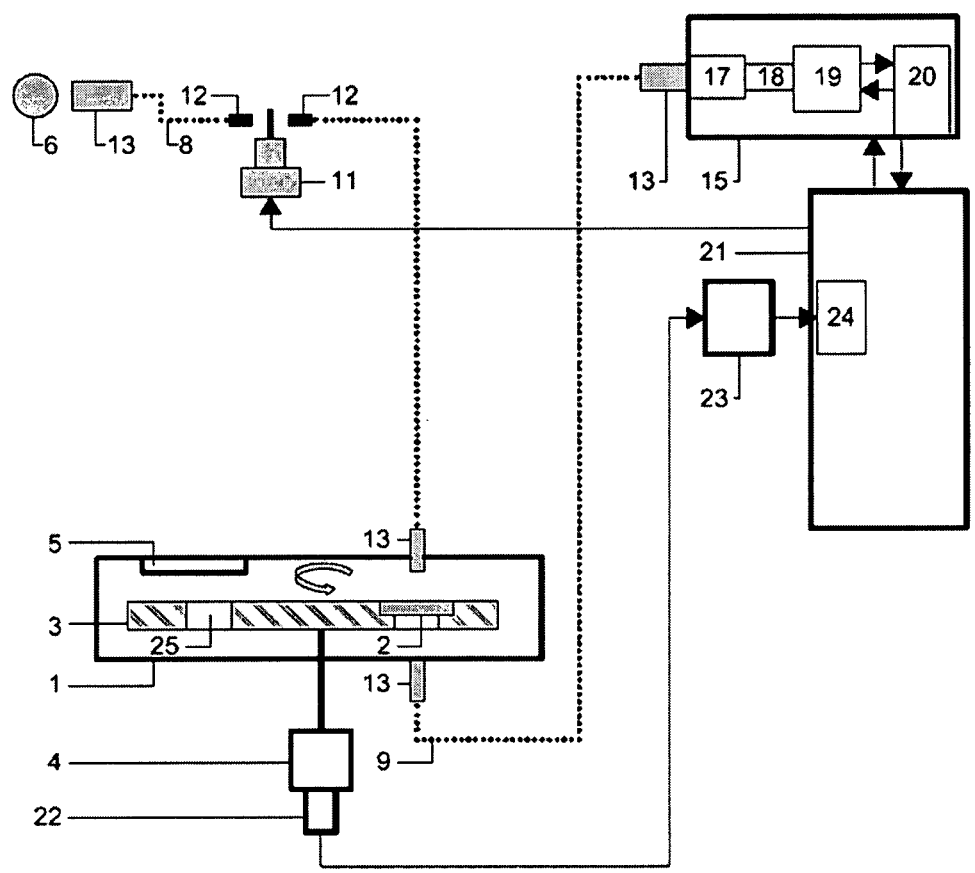

The optical monitoring system shown in FIG. 2 for measuring the layer thickness of a substrate revolving about an axis during a coating process operates with just one light chopper to generate measuring, reference, and dark phases.

The substrate carrier 3 herein exhibits an opening 25 on the same radius as the substrate 2 for forming a reference light path.

For measurement, a light source 6 injects light via a light guide head with collimator 13 in the first measuring light guide 8. In the first measuring light guide 8 there is a piezoelectric light chopper 11 arranged between two further light guide heads 12. The light guide heads 12 can also be realized as optical collimators. The chopper rims of the piezoelectric light chopper 11 can be moved with a piezoelectric actuator such that light is blocked or guided on unhindered. The control of the "open" or "closed" condition of the piezoelectric light chopper 11 takes place through the processor unit 21.

A light guide head with collimator 13 is fastened at the end of the first measuring light guide 8. This is arranged in a vacuum realization of the coating chamber 1 such that the light coming from the first measuring light guide 8 reaches the substrate 2 or goes through the opening 25.

The light guide head with collimator 13 fastened to the second measuring light guide 9 is arranged on a view window of the coating chamber 1 such that the light transmitted from the substrate 2 is received as measuring light, or the light let through the opening 25 is received as reference light and can be guided to the light detector unit 15.

A light detector 18 is fastened at the exit of the monochromator 17. The exit signals of the light detector 18 are amplified in the amplifier 19 and digitalized by an A/D converter 20. The time period of the digitalization is prescribed by the processor unit 21. The processor unit 21 reads out the digitalized values and processes them further.

An incremental encoder 22 is rigidly coupled with the drive wave of the rotation mechanism 4 of the substrate carrier 3. The signal of the incremental encoder 22, analogous to the practical example above, is switched to a counter 23 and evaluated by the processor unit 21.

Measuring Provides at Least Three Phases:

Measuring Phase:

The chopper rim of the piezoelectric light chopper 11 is open, so that light from the light source 6 is conducted through the first measuring light guide 8 to the substrate 2. The substrate 2 is illuminated once per each revolution. The light transmitted by the substrate is further guided through the second measuring light guide 9 to the light detector unit 15.

The beginning and end of the measuring period are adjusted for the A/D converter 20 by the comparator 24 such that measuring takes place when the substrate 2 is situated in the optical path. At the end of the measuring period the digitalized value of the measurement is read out by the processor unit 21.

Reference Phase:

The chopper rim of the piezoelectric light chopper 12 is open so that the light of the light source 6 is further lead through the opening 25 to the light detector unit 15. The monochromator adjustment is unchanged vis-à-vis the measuring phase.

The beginning and end of the measuring period are adjusted for the A/D converter 20 by the comparator 24 such that measuring takes place when the opening 25 is situated in the optical path. At the end of the measuring period the digitalized value of the measurement is read out by the processor unit 21.

Dark Phase:

The chopper rim of the piezoelectric light chopper 11 is closed. The beginning and end of the measuring period are independent of the rotation angle of the substrate 2 and are defined by the counter 23 and comparator 24. Dark measuring takes place sensibly immediately before or after a measuring phase and/or a reference phase. At the end of the measuring period the digitalized value of the measurement is read out by the processor unit 21.

To eliminate influences from outside light sources it is wise to carry out dark measuring when the substrate 2 is still situated in the optical path. Outside light is measured in the measuring phase as well as the dark phase and can be calculated out in the ensuing evaluation by differential formulation.

After the conclusion of the phases the measurement values are calculated thus: The differential values of the light intensities from the measuring and dark phase as well as from the reference and dark phase are put into the ratio ($I_{meas}-I_{dark}/I_{ref}-I_{dark}$). So a measurement value is available that is proportional to the light transmission of the substrate 2. Fluctuations in the light source 6 and in the sensitivity of the detector are compensated.

The invention claimed is:

1. An optical monitoring system for measurement of layer thicknesses of coatings applied to a substrate during a coating process, the optical monitoring system comprising:
    a light source;
    a light detector unit;
    a reference light guide, by which light of the light source is supplied to the light detector unit;
    a first measuring light guide, by which the light of the light source is directed to a substrate;
    a second measuring light guide, by which the light reflected or transmitted from the substrate is supplied to the light detector unit;
    a first light chopper arranged in the reference light guide; said first light chopper is a piezoelectric or electrostrictive or magnetostrictive light chopper;
    a second light chopper arranged in the first measuring light guide or second measuring light guide; said second light chopper is a piezoelectric or electrostrictive or magnetostrictive light chopper;
    and a revolving substrate carrier including a rotation mechanism connected with a processor unit configured to register a position of the substrate arranged on the revolving substrate carrier;
    wherein the first and second light choppers are connected with the processor unit, the processor unit is configured to generate a measuring phase, a reference phase, and at least one dark phase, and said processor unit is configured to digitally adjust the measuring phase, the reference phase, and the at least one dark phase depending on the position of the substrate and the processor unit is configured to synchronize a measuring point on the substrate to reduce a time jitter.

2. The optical monitoring system according to claim 1, wherein the light detector unit comprises a dispersive element and a light detector, by which the light wavelength of the light supplied to the light detector is adjustable via the dispersive element.

3. The optical monitoring system according to claim 2, wherein the dispersive element is a monochromator.

4. The optical monitoring system according to claim 1, wherein the light detector unit has a signal amplifier and an A/D converter.

5. The optical monitoring system according to claim 1, wherein the light detector unit is connected with the processor unit.

6. The optical monitoring system according to claim 1, further comprising an incremental encoder coupled to the rotation mechanism, wherein the incremental encoder is configured to set a counter at a defined value with each revolution on a defined rotation angle and to send pulses to the counter depending upon the rotation angle.

7. The optical monitoring system according to claim 6, wherein the processor unit is configured to evaluate a reading of the counter and to generate corresponding signals to control the light choppers.

8. An optical monitoring system for measurement of layer thicknesses of coatings applied on at least one substrate during a coating process, by which the substrate or substrates are arranged on a radius of a revolving substrate carrier comprising:
    a light source;
    a light detector unit;
    at least one opening of the substrate carrier, which is arranged on the radius of the substrate;
    a first measuring light guide, by which light of the light source is directed or can be directed on the substrate or the opening;
    a second measuring light guide, by which the light of the light source transmitted by the substrate, or the light of the light source transmitted through the opening is supplied or can be supplied to the light detector unit;
    a light chopper arranged in the first measuring light guide or second measuring light guide; and said light chopper is a piezoelectric or electrostrictive or magnetostrictive light chopper,
    a rotation mechanism connected with a processor unit configured to register a position of the substrate arranged on the revolving substrate carrier;

wherein the light chopper is connected with the processor unit, the processor unit is configured to generate a measuring phase, a reference phase, and at least one dark phase, and the processor unit is configured to digitally adjust the measuring phase, the reference phase, and the at least one dark phase depending on the position of the substrate and the processor unit is configured to synchronize a measuring point on the substrate to reduce a time jitter.

\* \* \* \* \*